United States Patent
Selcuk

[11] Patent Number: 6,165,882
[45] Date of Patent: Dec. 26, 2000

[54] POLYSILICON GATE HAVING A METAL PLUG, FOR REDUCED GATE RESISTANCE, WITHIN A TRENCH EXTENDING INTO THE POLYSILICON LAYER OF THE GATE

[75] Inventor: Asim Selcuk, Cupertino, Calif.

[73] Assignee: Advanced Micro Devices, Inc., Sunnyvale, Calif.

[21] Appl. No.: 09/283,753

[22] Filed: Apr. 2, 1999

[51] Int. Cl.[7] .................. H01L 21/336; H01L 21/3205; H01L 21/4763; H01L 21/44

[52] U.S. Cl. .................. 438/592; 438/291; 438/305; 438/595; 438/672

[58] Field of Search .................. 438/291, 305, 438/592, 595, 672

[56] References Cited

U.S. PATENT DOCUMENTS

| | | |
|---|---|---|
| 4,948,459 | 8/1990 | van Laarhoven et al. . |
| 5,341,016 | 8/1994 | Prall et al. . |
| 5,686,331 | 11/1997 | Song . |
| 6,060,376 | 5/2000 | Gabriel et al. . |
| 6,066,552 | 5/2000 | Figura . |

*Primary Examiner*—John F. Niebling
*Assistant Examiner*—Ron Pompey

[57] ABSTRACT

A device and method to reduce resistance in polysilicon gates by forming a highly conductive plug within a trench in the gate. This is achieved by etching a trench between nitride sidewalls and into the polysilicon layer and depositing a metal (e.g. tungsten) plug therein. Certain embodiments include a gate structure positioned on a silicon substrate and a gate oxide layer positioned on the silicon substrate, a polysilicon layer positioned on the gate oxide layer, a nitride layer, which includes nitride sidewalls, positioned on the polysilicon layer, and a tungsten plug that is positioned within a first trench portion between the nitride sidewalls and a second trench portion in the polysilicon layer.

18 Claims, 4 Drawing Sheets

POLYSILICON GATE HAVING A METAL PLUG, FOR REDUCED GATE RESISTANCE, WITHIN A TRENCH EXTENDING INTO THE POLYSILICON LAYER OF THE GATE

FIELD OF THE INVENTION

The present invention relates to high-density semiconductor devices, and in particular, to a method for forming a metal plug within a gate structure to reduce the resistance of the gate.

BACKGROUND OF THE INVENTION

Semiconductor integrated circuits contain many distinct electronic devices having conductive elements as part of the device structure. In order to operate as a circuit, each device needs to be electrically interconnected with other devices. Interconnection occurs during the fabrication process by forming an intricate network of conductive material in contact with certain elements of the devices. For example, part of a semiconductor integrated circuit may be made up of hundreds of discrete field effect transistors having interconnected gate electrodes.

The typical structure of a semiconductor integrated circuit includes a single crystal silicon substrate with doped regions forming the source and the drain of a transistor. The gate electrode is constructed by forming a layer of conductive polycrystalline silicon (polysilicon or simply "poly") above an insulating gate oxide layer. Polysilicon is less conductive than conductive metals, but has various advantages over the metals, such as allowing for a lower threshold voltage and higher density of cells. Since it has a moderately low sheet resistivity, the polysilicon layer can be extended to adjacent devices, thereby providing interconnection, but it is not adequate for interconnection over long distances. Interconnect lines made of polysilicon must have a relatively large cross-section in order to be conductive enough to operate effectively. This in turn increases the size of the overall integrated circuit, reducing speed and flexibility while increasing cost.

If conductivity were the only design criterion, a metal such as silver, aluminum or copper would be the material of choice to form device interconnections. However, many of the processes required in fabricating semiconductor integrated circuits use high temperature levels. Silver and aluminum have relatively low melting points subjecting them and surrounding material to corruption during subsequent fabrication steps. Their relatively high coefficient of thermal expansion as compared to materials such as silicon and silicon dioxide used in the fabrication of other microcircuit elements can cause stress, warping and separation as the metals expand and contract over such materials. Other highly conductive metals such as gold and copper rapidly diffuse through the substrate forming generation sites, thereby reducing minority carrier lifetime and degrading refresh performance in memory devices.

Currently, the methods and structures used for decreasing the sheet resistivity of polysilicon involve tungsten and titanium, which, although less conductive than silver, have a much higher melting point and smaller coefficient of thermal expansion. For example, one such method includes forming a layer of tungsten silicide ($WSi_x$, where X is any integer greater than or equal to 1, but most commonly 2 or 3 when used in integrated circuits) has been deposited atop the polysilicon layer.

Using titanium instead of tungsten provides greater conductivity, although other problems arise. Titanium silicide ($TiSi_x$) is formed by first depositing a layer of titanium a top the polysilicon and then applying heat to the layer. The resulting titanium silicide layer can suffer from severe agglomeration problems if the $TiSi_x$ layer is exposed to temperatures greater than 850° C. Since many fabrication processes require high levels of heat, the use of $TiSi_x$ becomes restricted. Other problems with using $TiSi_x$ include unwanted dopant segregation and diffusion of titanium down through the polysilicon in the substrate during heating, which can reduce minority carrier lifetime during operation. In addition, etching $TiSi_x$ is difficult because the layer created is very rough, having non-uniform thickness. This makes it difficult to stop etching the $TiSi_x$ without penetrating into the underlying polysilicon layer. If the titanium is etched prior to its conversion into $TiSi_x$, the volume change due to thermal expansion and contraction that occurs during conversion may cause cracks or voids to form.

Thus, there is a need for improved structures that increase the conductivity of the device elements and interconnections without the drawbacks described above.

SUMMARY OF THE INVENTION

The present invention provides a device and method to reduce resistance in polysilicon gates by forming a highly conductive plug within a trench in the gate. The present invention achieves this result by etching a trench between nitride sidewalls and into the polysilicon layer and depositing a metal plug therein.

The present invention advantageously provides an embodiment that includes a gate structure positioned on a silicon substrate and includes a gate oxide layer positioned on the silicon substrate, a polysilicon layer positioned on the gate oxide layer, a nitride layer, which includes nitride sidewalls, positioned on the polysilicon layer, and a tungsten plug that is positioned within a first trench portion between the nitride sidewalls and a second trench portion in the polysilicon layer. The method for reducing resistance of a gate in a semiconductor device according to the present invention includes etching a recess within the mask oxide layer, depositing a layer of nitride on the oxide layer and within the recess, and etching the nitride layer to form nitride spacers or sidewalls within the recess on a top surface of the polysilicon layer. The area between the sidewalls defines a first trench portion. The method further includes etching the portion of the polysilicon layer exposed through the recess between the sidewalls to form a second trench portion that extends downward from the base of the recess and into the polysilicon layer. Care should be taken not to etch through the polysilicon layer and into the gate oxide layer. An exemplary embodiment for preventing etching through the polysilicon layer and into the gate oxide layer is provided by the present invention. For example, the length of the etch can be timed based upon an expected etch rate.

Additional advantages and other features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

DETAILED DESCRIPTION OF THE INVENTION

The present invention advantageously provides a device and method to reduce resistance in polysilicon gates by forming a highly conductive plug within a trench in the gate. The present invention achieves this result by etching a trench between nitride sidewalls and into the polysilicon layer and depositing a tungsten plug therein.

Figure 1A:
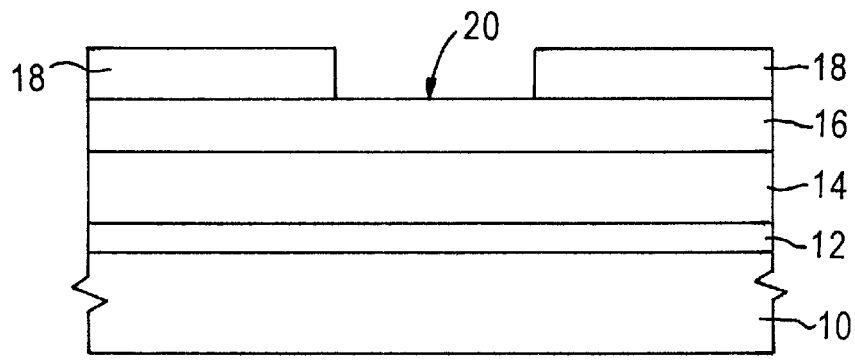
FIG. 1A is a partial, cross-sectional, side view of a semiconductor device according to the present invention depicting a silicon substrate having a gate oxide layer, a gate polysilicon layer, a mask oxide layer and a gate mask layer thereon.
Figure 1B:
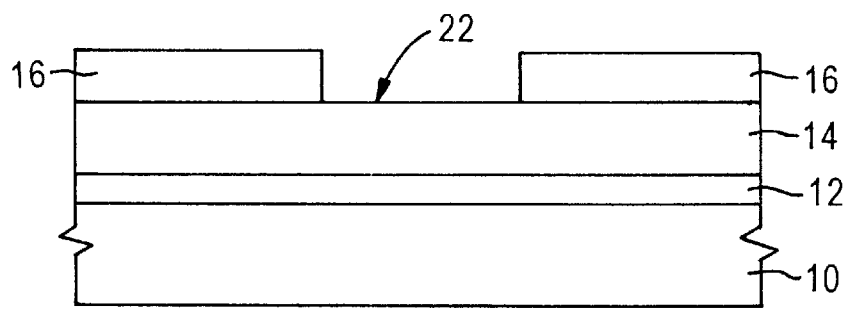
FIG. 1B is a partial, cross-sectional, side view of a semiconductor device according to the present invention depicting a mask oxide layer having a trench etched therein.

FIGS. 1A–1H depict a semiconductor device of the present invention at various stages along the manufacturing process. FIG. 1A is a cross-sectional view of a semiconductor substrate 10 upon which a gate will be fabricated. The substrate 10 is made of silicon and has a gate oxide layer 12 formed (i.e. deposited of grown) on a top surface of the substrate 10. The gate oxide layer 12 has a polysilicon layer 14 formed thereon and the polysilicon layer 14 has an oxide layer 16 formed thereon. The oxide layer 16 depicted in FIG. 1A has a photoresist mask 18, such as a reverse polarity gate mask, with an opening 20 that defines a finished gate region. FIG. 1B depicts the semiconductor device of FIG. 1A after a recess 22 has been etched in the oxide layer 16 through the opening 20 in the photoresist mask 18 at the finished gate region and the photoresist mask 18 has been removed. The recess 22 may be formed using any suitable processing method.

Figure 1C:
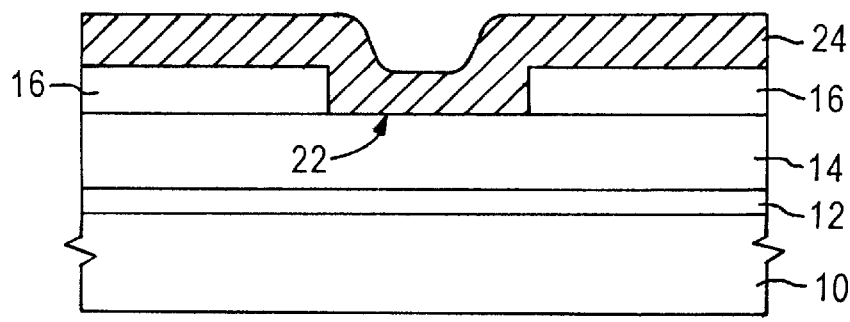
FIG. 1C is a partial, cross-sectional, side view of a semiconductor device according to the present invention depicting a nitride layer deposited upon the device of FIG. 1B.
Figure 1D:
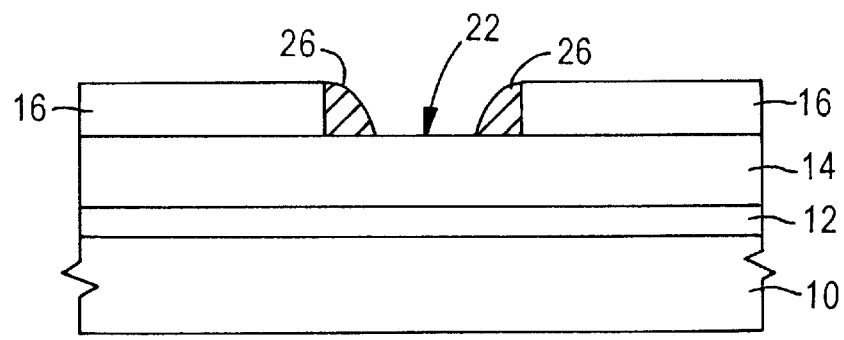
FIG. 1D is a partial, cross-sectional, side view of a semiconductor device according to the present invention depicting the nitride layer of FIG. 1C etched away to form nitride sidewalls.
Figure 1E:
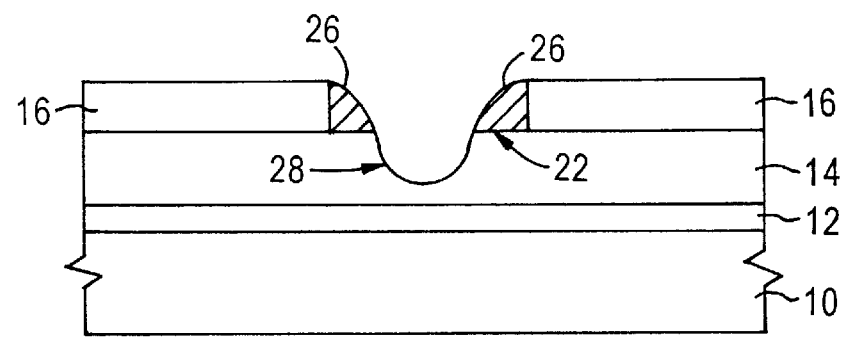
FIG. 1E is a partial, cross-sectional, side view of a semiconductor device according to the present invention depicting the device of FIG. 1D having a trench etched in the gate polysilicon layer.

FIG. 1C depicts the semiconductor device with a layer of nitride 24 deposited on the oxide layer 16 and within the recess 22. The nitride layer 24 is formed using any suitable processing method. As depicted in FIG. 1D, nitride spacers or sidewalls 26 are formed within the recess 22 on a top surface of the polysilicon layer 14 by etching the nitride layer 24. Any suitable anisotropic etching method can be used to form the sidewalls 26. FIG. 1D depicts a semiconductor device having a pair of sidewalls 26 formed on either side of the base of the recess 22 to define a first trench portion between the sidewalls 26. In FIG. 1E the portion of the polysilicon layer 14 exposed through the recess 22 between the sidewalls 26 is etched to form a second trench portion 28 that extends downward from the base of the recess 22 and into the polysilicon layer 14. Care should be taken not to etch through the polysilicon layer 14 and into the gate oxide layer 12, which could destroy the operation of the gate. It is of critical importance that the depth of the second trench portion 28 be controlled in order to maintain uniform gate resistance and to prevent etching through the polysilicon layer 14 and into the gate oxide layer 12. One way to prevent etching through the polysilicon layer 14 and into the gate oxide layer 12 is to time the length of the etch based upon the expected etch rate, as known to those of skill in the art of etching.

An exemplary depth of the second trench portion 28 is 2000 Å, when the polysilicon layer 14 has an exemplary thickness of 4000 Å. Hence, the depth of the second trench portion 28 may be about 50% of the total thickness of the polysilicon layer 14. This percentage may range from values of about 20% to about 70%.

Figure 1F:
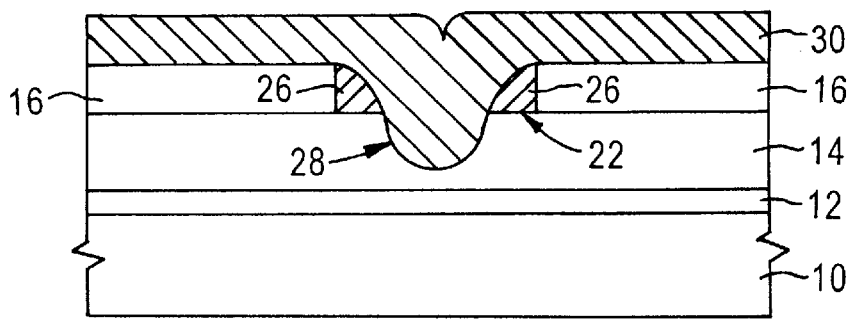
FIG. 1F is a partial, cross-sectional, side view of a semiconductor device according to the present invention depicting the device of FIG. 1E having a tungsten layer deposited within the gate polysilicon trench and the mask oxide trench.
Figure 1G:
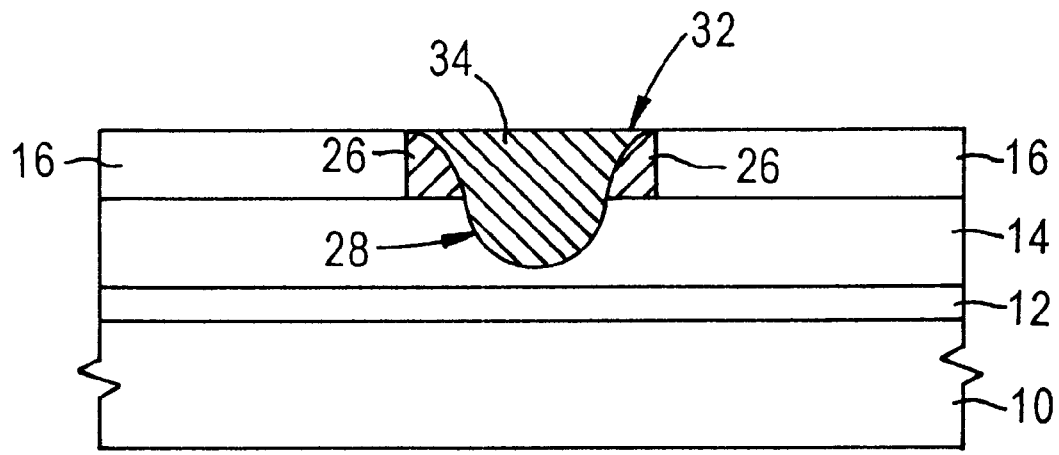
FIG. 1G is a partial, cross-sectional, side view of a semiconductor device according to the present invention depicting the device of FIG. 1F having the tungsten layer planarized to form a tungsten plug.
Figure 1H:
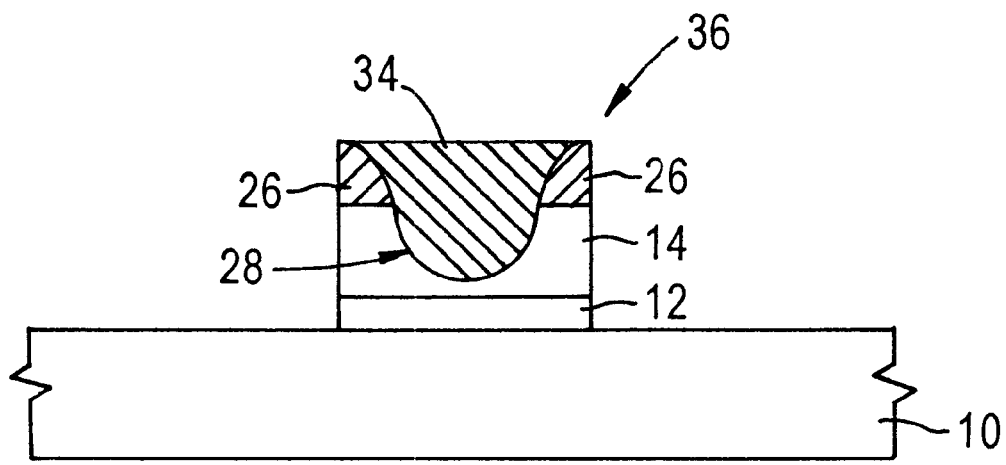
FIG. 1H is a partial, cross-sectional, side view of a semiconductor device according to the present invention depicting the device of FIG. 1G having the mask oxide layer, the gate polysilicon layer and the gate oxide layer etched to form a gate.

FIG. 1F depicts a tungsten layer 30 deposited over the oxide layer 16 such that the tungsten fills the first trench portion between the sidewalls 26 and the second trench portion 28. FIG. 1G depicts the semiconductor device after a planarization process has been performed such that a planar surface 32 is formed and a tungsten plug 34 is defined. Any suitable planarization process may be used, such as chemical-mechanical polishing (CMP). FIG. 1H depicts the gate 36 after the oxide layer 16 has been removed by a suitable etching process and the polysilicon layer 14 and gate oxide layer 12 have been etched to define the gate 36. This is accomplished by appropriate masking of the gate 36 and etching with a suitable etch recipe in an anisotropic fashion so that the nitride sidewalls 26 are not etched and the gate 36 is formed with the desired vertical walls.

The gate 36 is positioned on a silicon substrate 10 and includes a gate oxide layer 12 positioned on the silicon substrate 10, a polysilicon layer 14 positioned on the gate oxide layer 12, a nitride layer, which includes the nitride sidewalls 26, positioned on the polysilicon layer 14, and a tungsten plug 34 that is positioned within the first trench portion between the nitride sidewalls 26 and the second trench portion 28 in the polysilicon layer 14. The use of tungsten as the plug material is exemplary only, as other conductive materials may be employed without departing from the scope of the invention. The incorporation of a tungsten plug within the gate provides a compact structure that greatly improves the conductivity of the gate as compared to conventional gate structures.

Figure 2:
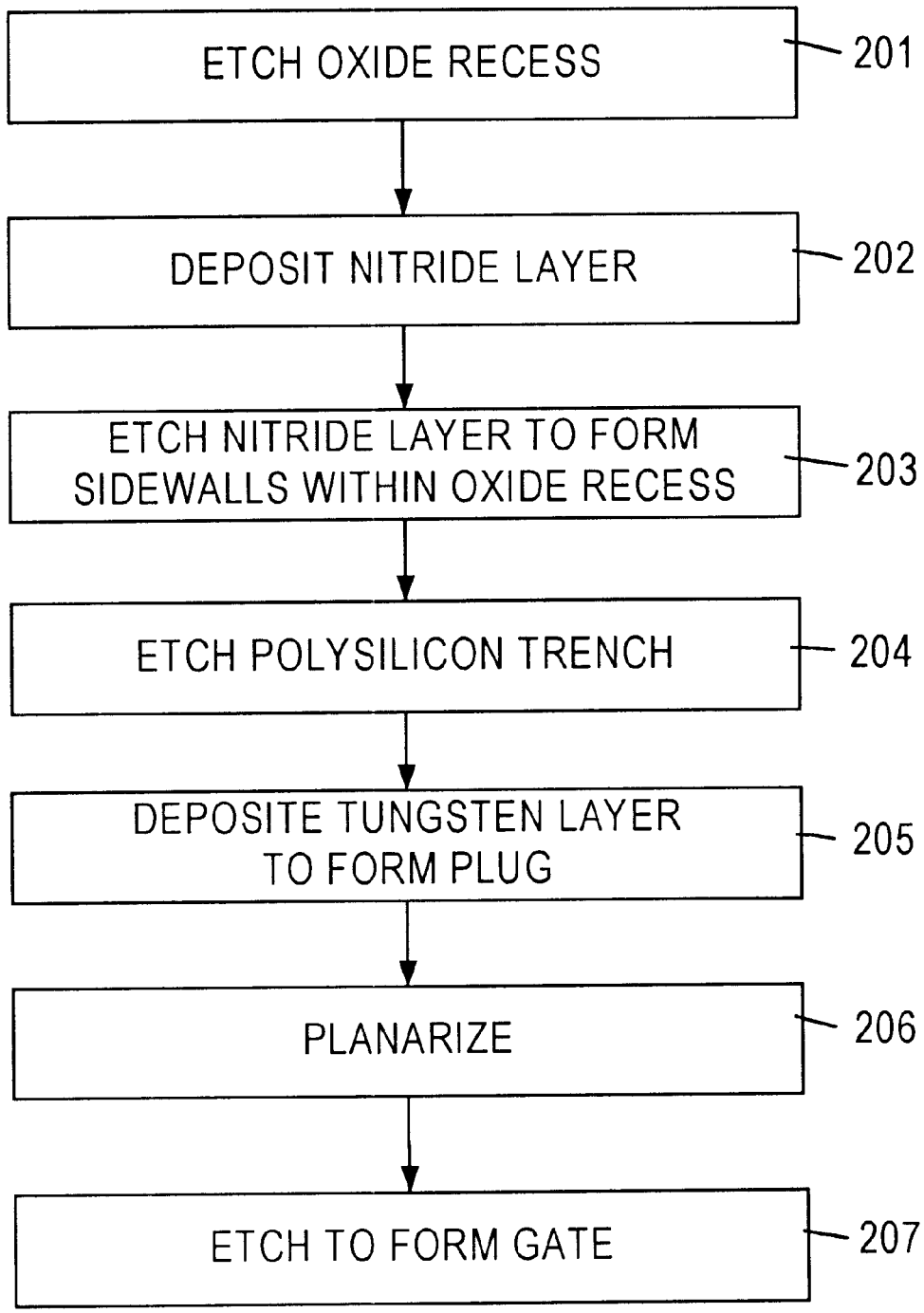
FIG. 2 is a flowchart of a method for reducing gate resistance according to the present invention.

FIG. 2 depicts a flowchart of a method for reducing gate resistance according to the present invention. The method for reducing resistance of a gate in a semiconductor device according to the present invention is performed on a gate being formed on a substrate and including a gate oxide layer formed on the substrate, a polysilicon layer formed on the gate oxide layer and a nitride layer formed on the polysilicon layer. Step 201 of the method includes etching a recess within the gate oxide layer. Step 201 preferably includes positioning a photoresist mask, such as a reverse polarity gate mask, with an opening that defines an finished gate region upon the oxide layer, and etching a recess in the oxide layer through the opening in the photoresist mask at the finished gate region. Step 202 includes depositing a layer of nitride on the oxide layer and within the recess, and step 203 includes etching the nitride layer to form nitride spacers or sidewalls within the recess on a top surface of the polysilicon layer. The area between the sidewalls defines a first trench portion. The nitride layer is preferably etched in an anisotropic manner to form the sidewalls. Step 204 includes etching the portion of the polysilicon layer exposed through the recess between the sidewalls to form a second trench portion that extends downward from the base of the recess and into the polysilicon layer. Care should be taken in step 204 not to etch through the polysilicon layer and into the gate oxide layer. It is of critical importance that the depth of the second trench portion be controlled in order to maintain uniform gate resistance and to prevent etching through the polysilicon layer and into the gate oxide layer. An exemplary way of preventing etching through the polysilicon layer and into the gate oxide layer is timing the length of the etch based upon an expected etch rate.

Once the first trench portion and the second trench portion have been formed, step 205 is performed, which includes depositing a tungsten layer (or other metal) over the oxide layer such that the tungsten fills the first trench portion between the sidewalls and the second trench portion. Step 206 includes planarizing the semiconductor device such that a planar surface is formed and a tungsten plug is defined. Any suitable planarization process may be used, such as chemical-mechanical polishing (CMP). Step 207 includes etching to form the gate. Step 207 preferably includes removing the oxide layer by an etching process and etching the polysilicon layer and gate oxide layer to define the gate. Once the gate has been formed the semiconductor device can be further processed as desired.

The present invention advantageously provides a device and method to reduce resistance in polysilicon gates by forming a highly conductive plug within a trench in the gate. The present invention achieves this result by etching a trench between nitride sidewalls and into the polysilicon layer and depositing a tungsten plug therein.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method for reducing resistance of a gate in a semiconductor device, the gate being formed on a substrate and including a gate oxide layer formed on the substrate, and a polysilicon layer formed on the gate oxide layer, said method comprising the steps of:

forming a trench in the gate extending into the polysilicon layer; and forming a conductive metal plug within the trench.

2. The method of claim 1, wherein the gate includes a nitride layer formed on the polysilicon layer, and the trench extends through the nitride layer.

3. The method of claim 2, wherein the step of forming a trench through the nitride layer and into the polysilicon layer comprises steps of:

forming a mask oxide layer on the polysilicon layer, the mask oxide layer having a recess extending therethrough;

forming nitride sidewalls defining a first trench portion within the recess; and etching a second trench portion within the polysilicon layer where the second trench portion is aligned between the nitride sidewalls, wherein the first trench portion and the second trench portion form the trench.

4. The method of claim 3, further comprising a step of removing the mask oxide layer after the step of forming the metal plug.

5. The method of claim 3, wherein the step of forming nitride sidewalls comprises the steps of:

depositing a nitride layer upon the mask oxide layer and within the recess; and etching the nitride layer to form sidewalls within the recess.

6. The method of claim 4, wherein the step of etching the nitride layer is performed anisotropically.

7. The method of claim 1, further comprising a step of planarizing the conductive metal plug.

8. The method of claim 1, wherein the conductive metal plug is made of tungsten.

9. The method of claim 1, wherein the step of forming the trench further comprises performing a timed etch on the polysilicon layer to form a trench portion within the polysilicon layer.

10. The method of claim 1, wherein the trench has a depth that ranges from about 20% to about 70% of a total thickness of the polysilicon layer.

11. The method of claim 10, wherein the trench has a depth of about 50% of the total thickness of the polysilicon layer.

12. A method for reducing resistance of a gate in a semiconductor device, the gate being formed on a substrate and including a gate oxide layer formed on the substrate, a polysilicon layer formed on the gate oxide layer and a spacer layer formed on the polysilicon layer, said method comprising the steps of:

forming a mask oxide layer on the polysilicon layer, the mask oxide layer having a recess extending therethrough;

forming spacer sidewalls defining a first trench within the recess;

etching a second trench within the polysilicon layer where the second trench is aligned between the spacer sidewalls;

forming a metal plug within the first trench and the second trench; and removing the mask oxide layer.

13. The method of claim 12, wherein the step of forming spacer sidewalls comprises the steps of:

depositing a spacer layer upon the mask oxide layer and within the recess; and etching the spacer layer to form sidewalls within the recess.

14. The method of claim 13, wherein the step of etching the spacer layer is performed anisotropically.

15. The method of claim 12, further comprising planarizing the metal plug.

16. The method of claim 13, wherein the spacer layer comprises nitride.

17. The method of claim 12, wherein the metal comprises tungsten.

18. The method of claim 12, wherein the step of etching the second trench comprises a step of performing a timed etch on the polysilicon layer to form the second trench within the polysilicon layer.

* * * * *